United States Patent
Tezuka et al.

[11] Patent Number: 6,004,872
[45] Date of Patent: Dec. 21, 1999

[54] METHOD OF MANUFACTURING SEMICONDUCTOR DEVICE

[75] Inventors: Yoshihiro Tezuka, Kofu; Kunihiro Tada, Nirasaki, both of Japan

[73] Assignee: Tokyo Electron Limited, Tokyo, Japan

[21] Appl. No.: 08/959,845

[22] Filed: Oct. 29, 1997

[30] Foreign Application Priority Data

Nov. 13, 1996 [JP] Japan .................................... 8-317125

[51] Int. Cl.$^6$ ............................................. H01L 21/3205
[52] U.S. Cl. .......................... 438/592; 438/683; 438/656
[58] Field of Search .................................. 438/592, 683, 438/656

[56] References Cited

U.S. PATENT DOCUMENTS

| | | | |
|---|---|---|---|
| 4,957,777 | 9/1990 | Ilderem et al. | 438/677 |
| 5,510,295 | 4/1996 | Cabral, Jr. et al. | 438/656 |
| 5,545,574 | 8/1996 | Chen et al. | 438/297 |

FOREIGN PATENT DOCUMENTS

| | | |
|---|---|---|
| 58-58766 | 4/1983 | Japan . |
| 7-297136 | 11/1995 | Japan . |
| 8-97294 | 4/1996 | Japan . |

*Primary Examiner*—John F. Niebling
*Assistant Examiner*—John Murphy
*Attorney, Agent, or Firm*—Oblon, Spivak, McClelland, Maier & Neustadt, P.C.

[57] ABSTRACT

A method of manufacturing a semiconductor device, comprises the steps of, preparing a silicon substrate having a source region, a drain region, a gate electrode and an $SiO_2$ film formed on one surface, depositing titanium on the one surface of the silicon substrate by CVD using a high frequency plasma of a low density to form a $TiSi_2$ layer having a C54 crystal phase, so that the $TiSi_2$ layer covers the source and drain regions and gate electrode, and a Ti layer covers the $SiO_2$ film. The Ti layer formed on the $SiO_2$ film is removed by a selective etching.

5 Claims, 6 Drawing Sheets

METHOD OF MANUFACTURING SEMICONDUCTOR DEVICE

BACKGROUND OF THE INVENTION

The present invention relates to a method of manufacturing a semiconductor device such as an integrated circuit, particularly, to a technique useful for forming an electrode.

In the manufacture of a semiconductor device such as a semiconductor integrated circuit, various treatments such as a film-forming treatment, an etching treatment, and a doping treatment are performed repeatedly to form desired circuit elements on a substrate. When it comes to, for example, an MOS type semiconductor device, source and drain regions are formed by applying a doping treatment to desired surface regions of a silicon substrate to form diffusion layers. Further, for electrically connecting these diffusion layers to wiring layers, an interlayer insulating film covering these source and drain regions are selectively etched to form contact holes, followed by embedding a metal in these contact holes by a film-forming technique.

For improving the characteristics of a semiconductor integrated circuit, it is necessary to lower the sheet resistance of each of the diffusion layers forming the source and drain regions and the gate electrode. A so-called silicide technique, which is intended to lower the sheet resistance, is disclosed in, for example, Japanese Patent Disclosure (Kokai) No. 58-58766. It is disclosed that, after formation of the gate, source and drain regions, the entire surface of a silicon semiconductor substrate is covered with a metal layer having a high melting point, followed by applying an annealing treatment to convert only those portions of the metal layer which cover the gate, source and drain regions into silicide layers. Then, the unreacted metal layer is removed by a selective etching.

The silicide technique includes, for example, a titanium silicide technique in which a $TiSi_2$ film is formed by self-alignment on the source and drain regions and on the gate electrode in order to lower the sheet resistance on any of the gate electrode and source and drain regions. In the titanium silicide technique, a Ti layer is formed first to cover the entire substrate surface by a sputtering method, followed by annealing the Ti layer at about 650° C. under a nitrogen gas atmosphere. In this step, the part of the Ti layer in direct contact with silicon, i.e., in direct contact with each of the source and drain regions and the gate electrode, carries out reaction with silicon to form a $TiSi_2$ layer. What should be noted, however, is that the $TiSi_2$ layer thus formed has a C49 crystal phase having a relatively high resistivity, not a C54 crystal phase having a low resistivity.

In the next step, the unreacted Ti layer is removed by a selective etching, followed by applying a second annealing treatment to the substrate at a high temperature of about 800° C. so as to convert the C49 crystal phase of $TiSi_2$ into the C54 crystal phase having a low resistivity. If a Ti layer formed on an $SiO_2$ insulating film is heated to 800° C. or more, the metal Ti reacts with $SiO_2$, making it difficult to remove the unreacted metal Ti in the subsequent step by a selective etching. To avoid this difficulty, the second annealing treatment is applied after removal of the metal Ti by the selective etching.

The conventional titanium silicide technique outlined above necessitates complex treatments and, thus, involves as many as 4 steps including the final step of the second annealing treatment, leading to a high manufacturing cost of the semiconductor device.

Measures for overcoming the above-noted difficulties are proposed in, for example, Japanese Patent Disclosures Nos. 8-97294 and 7-29713. It is proposed to form a Ti layer by a plasma CVD utilizing an electron cyclotron resonance (ECR), which uses a micro wave, or by a plasma CVD utilizing a helicon wave. This technique permits a Ti layer in direct contact with silicon to perform reaction with silicon so as to form directly a $TiSi_2$ layer of the C54 crystal phase having a low resistivity without requiring an annealing treatment. However, it is necessary to use a plasma film-forming apparatus of complex structure. In addition, the $TiSi_2$ layer formed by reaction of the deposited Ti with a silicon layer including a polycrystalline silicon layer is very thin relative to a Ti layer formed on an insulating film such as an $SiO_2$ film, though the $TiSi_2$ layer is certainly thicker than the Ti layer. Specifically, a ratio in thickness of the $TiSi_2$ layer to the Ti layer is only about 2. As a result, a considerably large proportion of the $TiSi_2$ layer is etched away in the subsequent step of removing the Ti layer by a selective etching. The etching of the $TiSi_2$ layer results in failure to lower sufficiently the sheet resistance of the diffusion layer, though the particular technique certainly permits decreasing the number of process steps. Since it is required nowadays to achieve further miniaturization by improving the density and degree of integration of a semiconductor integrated circuit, it is strongly required to develop a technique which permits forming a diffusion layer of a low resistivity while decreasing the number of required process steps and, thus, suppressing the manufacturing cost.

BRIEF SUMMARY OF THE INVENTION

An object of the present invention is to provide a method of manufacturing a semiconductor device, which permits forming by self-alignment a titanium silicide layer without using a plasma apparatus of complex structure and which also permits decreasing the number of process steps.

As a result of an extensive research on the formation of a titanium silicide layer by self-alignment, the present inventors have found that a titanium silicide layer of C54 crystal phase can be formed at a high ratio in thickness of the titanium silicide layer to a titanium layer without applying a special annealing treatment by performing a film formation under a low plasma density, e.g., of the order of $10^9$ cm$^{-3}$, not a high plasma density, e.g., of the order of $10^{11}$ cm$^{-3}$, as in the case of using an ECR plasma film-forming apparatus or a helicon wave plasma film-forming apparatus, arriving at the present invention.

According to a first aspect of the present invention, there is provided a method of manufacturing a semiconductor device, comprising the steps of:

preparing a substrate having at least one silicon or polycrystalline silicon region and a silicon compound film formed on one surface thereof; and forming a titanium layer on the surface of the substrate by a chemical vapor deposition (CVD) method using a high frequency plasma of a low density, the titanium deposited on the silicon or polycrystalline silicon region reacting with silicon or polycrystalline silicon to form a titanium silicide ($TiSi_2$) layer having a C54 crystal phase.

In the present invention, titanium is deposited on a silicon region (including a polycrystalline silicon region) by CVD (chemical vapor deposition) using a high frequency plasma of a low density. The particular technique makes it possible to form a $TiSi_2$ layer having a C54 crystal phase without employing an annealing treatment, though it is necessary to apply an annealing treatment a plurality of times in the prior art. Naturally, the number of manufacturing process steps can be markedly decreased, compared with the prior art requiring a plurality of times of an annealing treatment. Also, CVD is performed under a plasma of a low density. Naturally, the plasma CVD apparatus used in the present invention is simpler in construction than the apparatus which generates a plasma of a high density. For example, it is possible to use in the present invention a parallel plate type plasma film-forming apparatus whose plasma density is lower than that of an ECR plasma film-forming apparatus. The density of the plasma generated in the ECR plasma film-forming apparatus is excessively high. Where the plasma density is unduly high, a satisfactory difference in the growing rate, or thickness, is not brought about between the $TiSi_2$ layer on the silicon region (including the polycrystalline silicon region) and the Ti layer on the silicon oxide film, resulting in failure to perform effectively the subsequent selective etching treatment.

According to a second aspect of the present invention, there is provided a method of manufacturing a semiconductor device, comprising the steps of:

preparing a silicon substrate having a source region, a drain region, a gate electrode and an insulating film formed on one surface;

depositing titanium on the one surface of the silicon substrate by CVD using a high frequency plasma of a low density to form a $TiSi_2$ layer having a C54 crystal phase, the $TiSi_2$ layer covering at least the source and drain regions, and a Ti layer covering the insulating film; and removing the Ti layer formed on the insulating film by a selective etching.

In the second aspect, Ti is deposited by CVD using a high frequency plasma on a silicon substrate having a source region, a drain region and a gate electrode formed therein in advance. The particular technique makes it possible to form a $TiSi_2$ layer having a C54 crystal phase on the source and drain regions and on the gate electrode, as required, without employing an annealing treatment. Then, the unreacted Ti layer formed on the insulating film is removed by a selective etching, with the result that a $TiSi_2$ layer having a low resistivity is formed on only the source-drain regions and gate electrode. Naturally, the second aspect also permits markedly decreasing the number of manufacturing process steps.

It is desirable to control the film-forming conditions such as the substrate temperature and density of the high frequency power so as to obtain at least 5 of a film-forming ratio, i.e., a ratio in thickness of the $TiSi_2$ layer on the silicon region to the Ti layer on the silicon oxide film. Specifically, it is desirable to perform CVD under the substrate temperature falling within a range of between 620° C. and 700° C. and under the high frequency power density falling within a range of between 0.5 W/cm² and 2.0 W/cm².

In the following description, the term "silicon" denotes a concept including polycrystalline silicon. Likewise, "silicon region" denotes a concept including polycrystalline silicon region.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Let us describe a method of manufacturing a semiconductor device according to one embodiment of the present invention with reference to the accompanying drawings.

Figure 1:
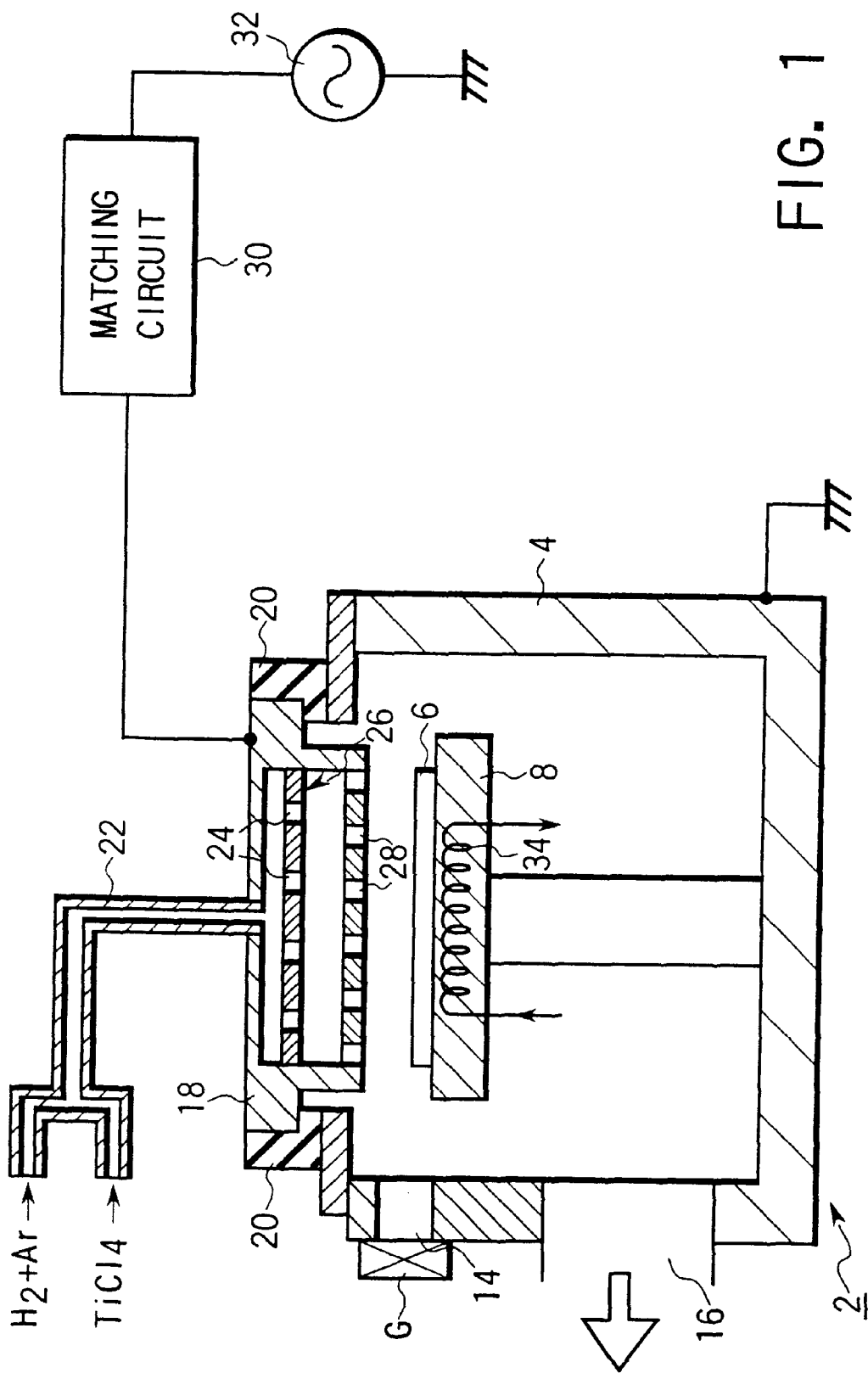
FIG. 1 is a view schematically showing a parallel plate type plasma film-forming apparatus for working the method according to one embodiment of the present invention.

In this embodiment, a parallel plate type plasma film-forming apparatus 2 shown in FIG. 1 is used for depositing Ti. As shown in the figure, the apparatus 2 comprises a cylindrical process chamber 4 made of a metal, e.g., aluminum, and connected to the ground. A circular susceptor 8 supporting a silicon substrate 6 to be processed thereon is formed inside the process chamber 4. The susceptor 8, which is set at, for example, zero potential, constitutes a lower electrode.

A transfer port 14 of the silicon substrate, which can be opened and closed by a gate valve G, is formed in an upper portion of the side wall of the process chamber 4. Also, an exhaust port 16 connected to a vacuum pump (not shown) is formed in a lower portion of the side wall for evacuating the process chamber 4.

In order to introduce a process gas into a process space, a hollow shower head 18 made of, for example, aluminum is mounted in an open ceiling portion of the process chamber 4 via an insulator 20 made of, for example, quartz. As apparent from the figure, the shower head 18 is positioned to face the upper surface of the susceptor 8. A gas supply pipe 22 is connected at one end to an upper portion of the shower head 18 and at the other end to various gas sources, that is, a process gas source, reducing gas source, and carrier gas source (not shown). A process gas is supplied at a controlled flow rate through the pipe 22 and shower head 18 into the process space. A $TiCl_4$ gas is used as a process gas, which is introduced into the process space together with a $H_2$ gas as a reducing gas and an inert gas, e.g., Ar gas, as a carrier gas.

A diffusion plate 26 having a large number of diffusion holes 24 is horizontally arranged within the shower head 18. The process gas supplied into the shower head 18 is diffused when passing through the diffusion holes 24 so as to permit the diffused process gas to be introduced into the process space between the shower head 18 and the lower electrode 8.

The shower head 18 is connected to a matching circuit 30, which is further connected to a high frequency power source 32 for plasma generation. It follows that the shower head 18 functions as an upper electrode. If a high frequency power is applied between the upper electrode (shower head 18) and the lower electrode (susceptor 8), a plasma is generated in the process space. A high frequency power of, for example, 13.56 MHz is used in this embodiment. However, power of another frequency such as 40.68 MHz or 380 KHz can also be used for generating a plasma.

A heating means 34 such as a resistance heater is embedded in the susceptor 8 for heating the silicon substrate 6 to a desired temperature.

In the preferred embodiment, the silicon substrate 6 having at least one of a P-type region, an N-type region and a silicon region formed on one surface as well as a silicon oxide film by suitable device or devices is set in the plasma film-forming apparatus 2 constructed as shown in FIG. 1. Then, a low density plasma of the order of, for example, $10^9$ $cm^{-3}$ is generated from the process gas within the process space to deposit metal Ti on the entire upper surface of the substrate. Instantly after deposition, Ti reacts with Si in the base layer to form a $TiSi_2$ layer having a C54 crystal phase. On the other hand, Ti deposited on the silicon oxide film (insulating film) does not carry out reaction with Si and remains on the insulating film to form a Ti layer. In performing the plasma CVD, the silicon substrate 6 is disposed on the susceptor 8, followed by evacuating the process chamber 4 to a predetermined degree of vacuum. Under this condition, the substrate 6 is heated to at least 620° C., and a gas mixture consisting of $TiCl_4$, $H_2$ and Ar is introduced through the shower head 18 into the process space. At the same time, a high frequency power is applied between the shower head 18 and the susceptor 8 so as to generate a plasma in the process space and, thus, to deposit Ti on the substrate surface.

It should be noted that Ti is deposited at a high rate on the silicon region such as the P-type region, N-type region and polycrystalline silicon region of the substrate surface. Instantly after deposition, Ti reacts with Si to form a $TiSi_2$ layer having a C54 crystal phase. On the other hand, Ti is deposited on the silicon oxide film at a rate lower than the deposition rate on the silicon region. Also, the deposited Ti does not react with Si and forms a metal Ti layer.

To be more specific, $TiCl_x$ (x=1, 2 or 3) radicals derived from the $TiCl_4$ gas and hydrogen radicals are contained in the plasma. These radicals perform reaction on the Si surface to generate metal Ti. Further, the resultant Ti reacts with Si to form $TiSi_2$. It should be noted that Ti free from a metallic bond reacts with Si, with the result that formed is a $TiSi_2$ layer of a C54 crystal phase, which is stable at 620° C. or higher. Further, this reaction is promoted because the base layer is formed of Si. It follows that a growing rate of the $TiSi_2$ layer formed on the silicon base layer is rendered higher than that of the Ti layer formed on the $SiO_2$ layer.

It is desirable to carry out the plasma CVD at 620 to 700° C., preferably at 640 to 660° C. If the film-forming temperature is lower than 620° C., the resultant $TiSi_2$ layer has an excessively high resistivity. On the other hand, if the temperature is higher than 700° C., current leakage tends to take place between the gate and the source and between the gate and the drain, as apparent from FIGS. 2, 3A and 3B.

Figure 2:
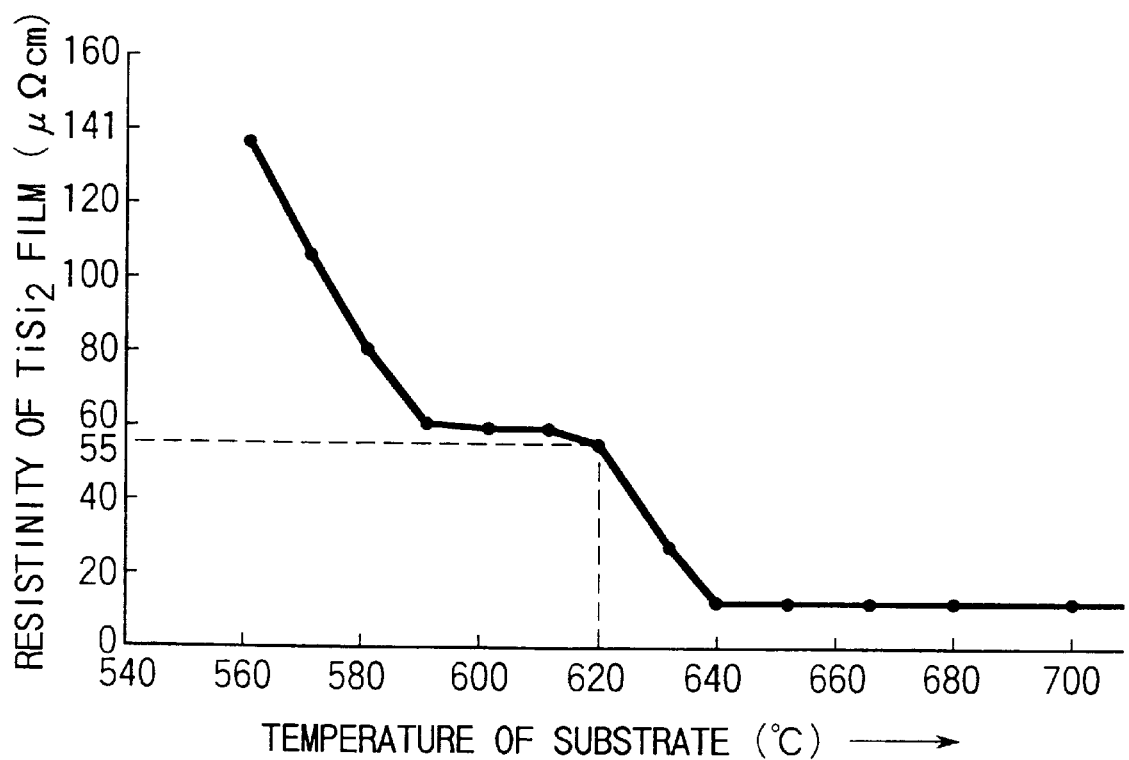
FIG. 2 is a graph showing the temperature dependency of a $TiSi_2$ layer formed by plasma CVD.
Figure 3A:
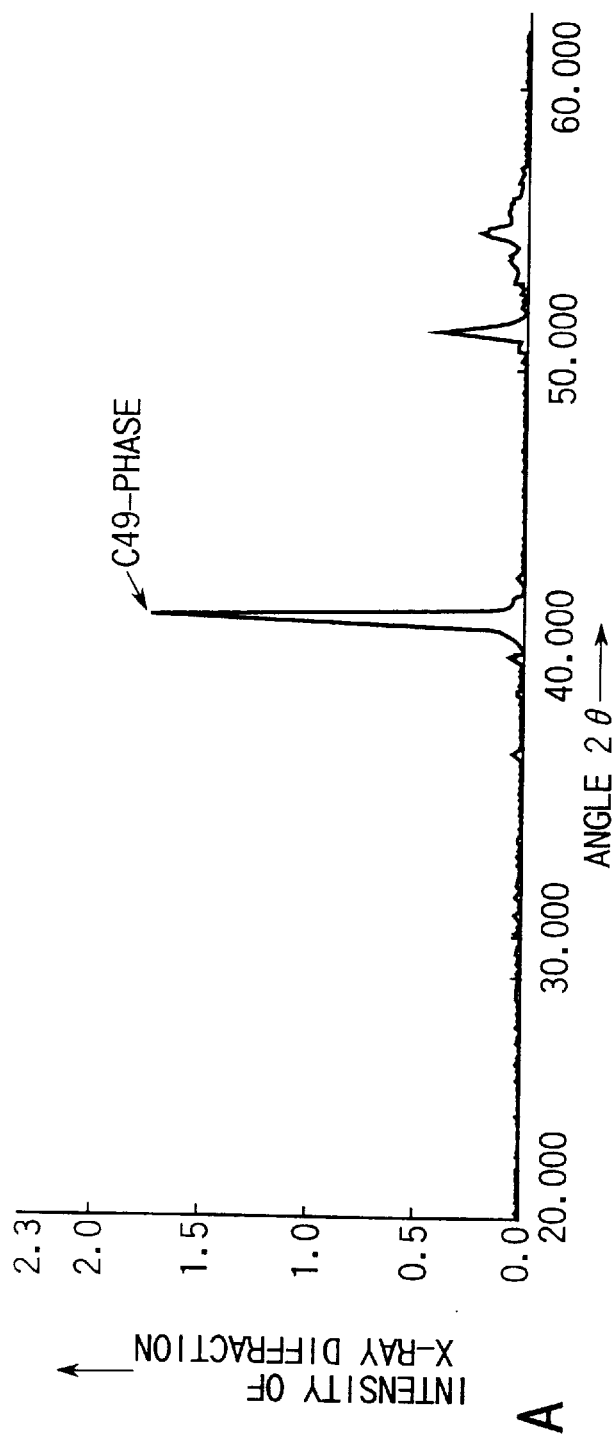
FIGS. 3A and 3B are graphs showing the results of X-ray diffraction applied to $TiSi_2$ layers formed at different temperatures.
Figure 3B:
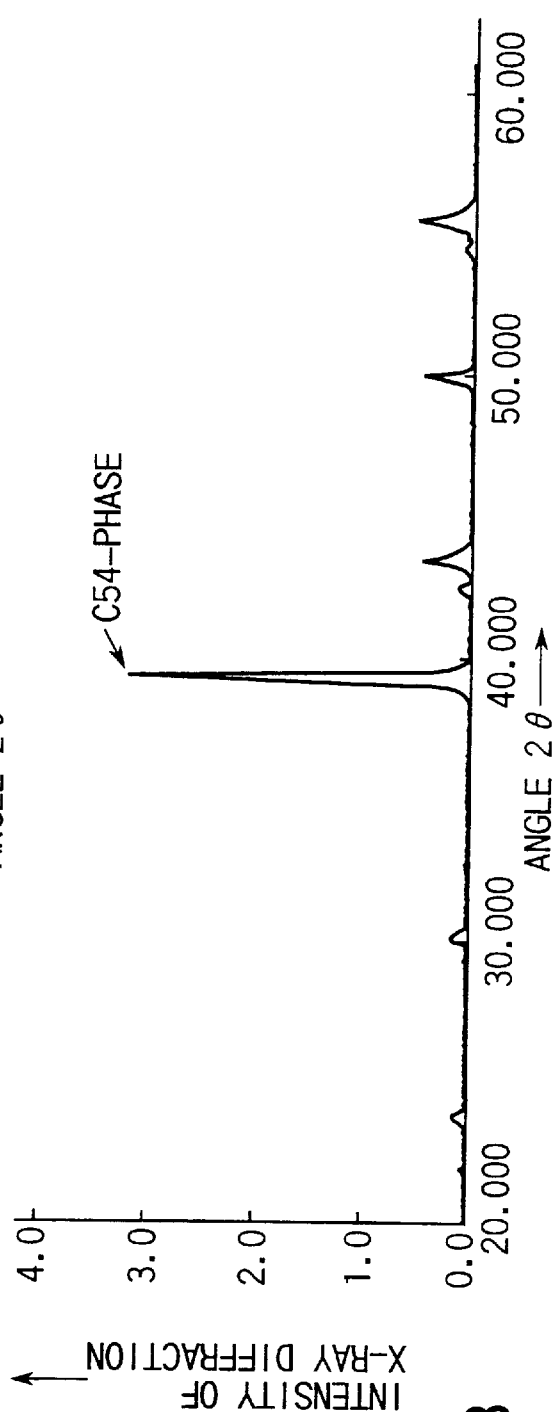

To be more specific, FIG. 2 is a graph showing the relationship between the resistivity of the plasma CVD-$TiSi_2$ layer, which is plotted on the ordinate, and the substrate temperature, which is plotted on the abscissa. As apparent from the graph, the resistivity of the $TiSi_2$ layer is sufficiently low, i.e., about 55 $\mu\Omega.cm$ or less, where the substrate temperature is 620° C. or higher. This is supported by X-ray diffraction. Specifically, FIGS. 3A and 3B are 2θ graphs of the X-ray diffraction of the plasma CVD-$TiSi_2$ layer noted above. FIG. 3B covers the case where the substrate temperature was set at 650° C. in the film-forming step; whereas, FIG. 3A is directed to a comparative case in which the substrate temperature was set at 600° C. in the film-forming step. As apparent from FIG. 3A, the most portion of the $TiSi_2$ layer was found to have a C49 crystal phase, where the substrate temperature was set at 600° C. On the other hand, FIG. 3B shows that, where the substrate temperature was set at 650° C., the most portion of the $TiSi_2$ layer was found to have a C54 crystal phase, which has a low resistivity.

Figure 4:
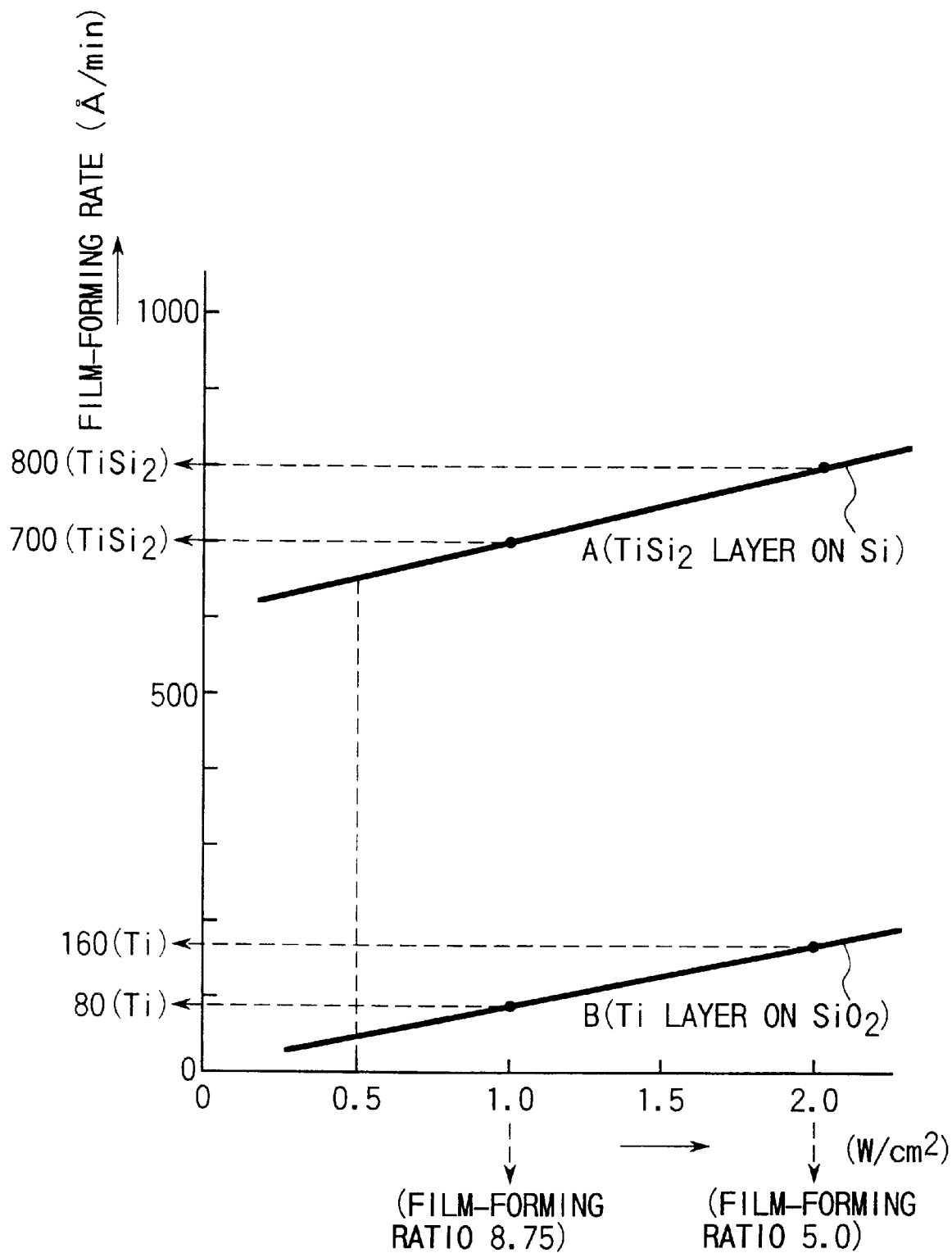
FIG. 4 is a graph showing the relationship between the high frequency power density and the film-forming rates of a $TiSi_2$ layer and a Ti layer.

It is also desirable to set the high frequency power density to fall within a range of between 0.5 $W/cm^2$ and 2.0 $W/cm^2$, as apparent from a graph of FIG. 4 showing the relationship between a film-forming rate, i.e., thickness of film formed in a minute, which is plotted on the ordinate, and a power density, which is plotted on the abscissa. Line A in FIG. 4 denotes a $TiSi_2$ layer formed directly on a silicon base layer, with line B representing a Ti layer formed on an $SiO_2$ film. It is generally known to the art that, in order to remove completely the Ti layer by the subsequent selective etching while ensuring a sufficient thickness of the $TiSi_2$ layer of the C54 crystal phase having a low resistivity, it is necessary for the film-forming ratio, i.e., a ratio in thickness of the $TiSi_2$ layer to the Ti layer, to be at least 5. FIG. 4 shows that the high frequency power density required for ensuring a film-forming ratio of 5 is 2.0 $W/cm^2$. On the other hand, in order to obtain a practically reasonable film-forming rate, the lower limit of the power density should be about 0.5 $W/cm^2$ at which the $TiSi_2$ film-forming rate is about 650 Å/min.

Figure 5A:
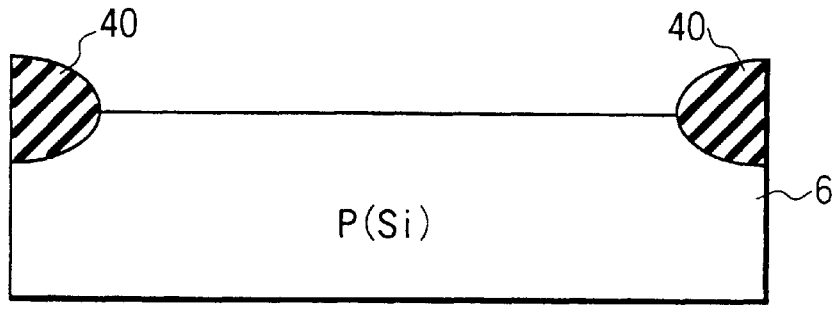
FIGS. 5A to 5H are cross sectional views collectively showing a method according to one embodiment of the present invention.
Figure 5B:
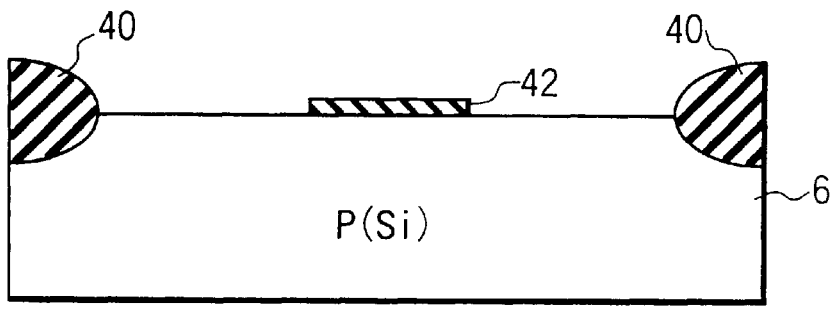
Figure 5C:
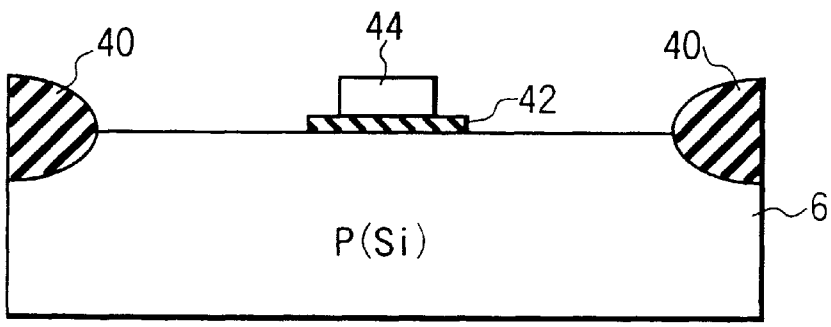
Figure 5D:
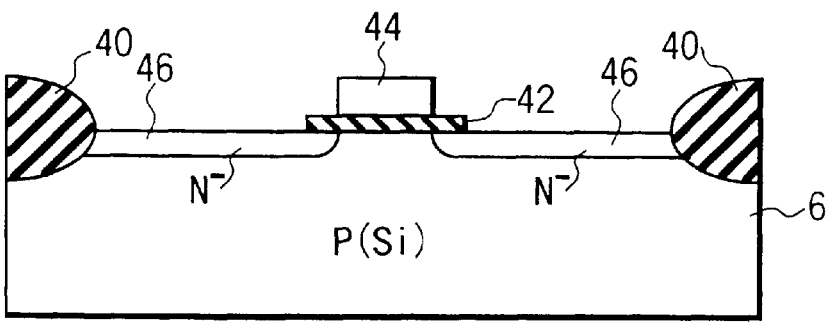
Figure 5E:
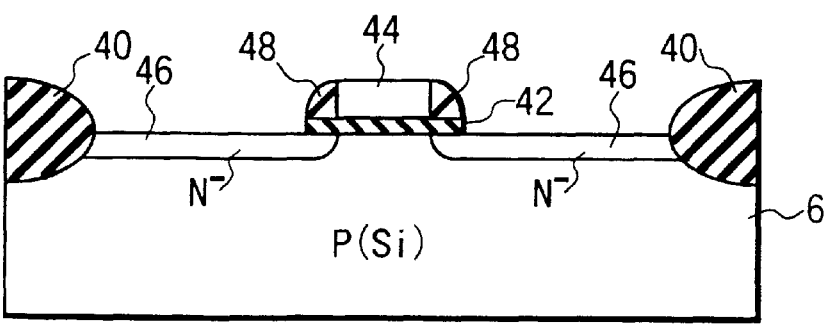
Figure 5F:
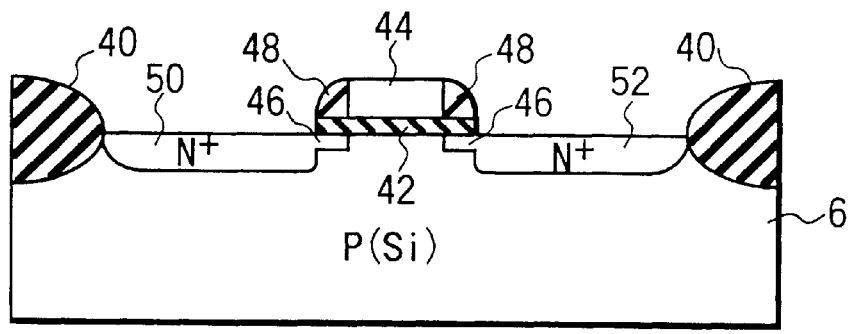

Let us describe how to manufacture a semiconductor device, i.e., an MOS LSI having a titanium silicide structure, by the method of the present invention with reference to FIGS. 5A to 5H. In the first step, a field oxide film 40 consisting of $SiO_2$ is selectively formed by thermal oxidation on a surface of a P-type silicon substrate 6 so as to isolate respective active regions (in FIG. 5A, one of the active regions, i.e., element forming region is shown). Then, a gate insulating film 42 consisting of $SiO_2$ is formed by CVD in a predetermined portion within the active region surrounded by the field oxide film 40, as shown in FIG. 5B, followed by forming a gate electrode 44 consisting of a polycrystalline silicon (poly-Si) doped with an impurity on the gate insulating film 42, as shown in FIG. 5C. In forming the gate electrode 44, an impurity-doped poly-Si film is formed on the entire surface of the silicon substrate 6, followed by selectively etching the poly-Si film in a desired pattern. Then, an N-type impurity is introduced in a low concentration into a surface region of the silicon substrate 6 by ion implantation using the gate electrode 44 and the field oxide film 40 as a mask so as to form $N^-$-type regions 46 of a low impurity concentration on both sides of the gate, as shown in FIG. 5D. After formation of the $N^-$-type regions 46, an $SiO_2$ film is formed on the entire surface of the substrate by CVD, followed by anisotropically etching the $SiO_2$ film by means of a reactive ion etching to form a side wall 48 on the side portion of the gate electrode 44, as shown in FIG. 5E. Then, an N-type impurity is introduced in a high concentration into the $N^-$-type regions 46 by ion implantation using the side wall 48 and the field oxide film 40 as a mask so as to form $N^+$-type source and drain regions 50 and 52, as shown in FIG. 5F. Further, the substrate is annealed so as to electrically activate the implanted impurity ions, thereby preparing a poly-Si gate MOS FET of the ordinary LLD (lightly doped drain) structure on which metal Ti is to be deposited. The steps for forming the structure shown in FIG. 5F need not be limited to those described above. In other words, it is possible to form the particular structure by known process steps.

Figure 5G:
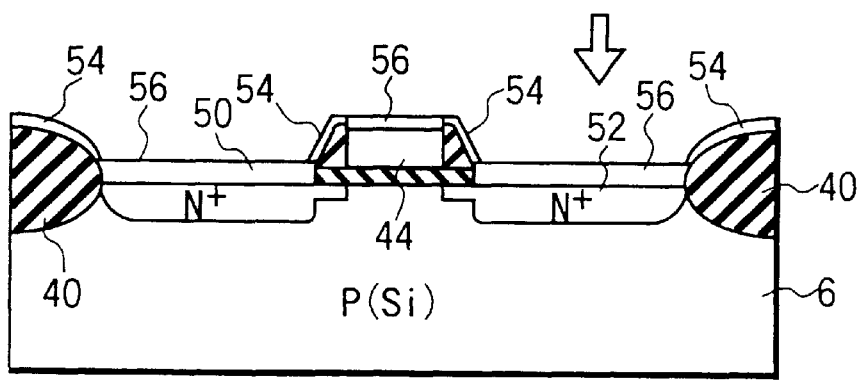
Figure 5H:
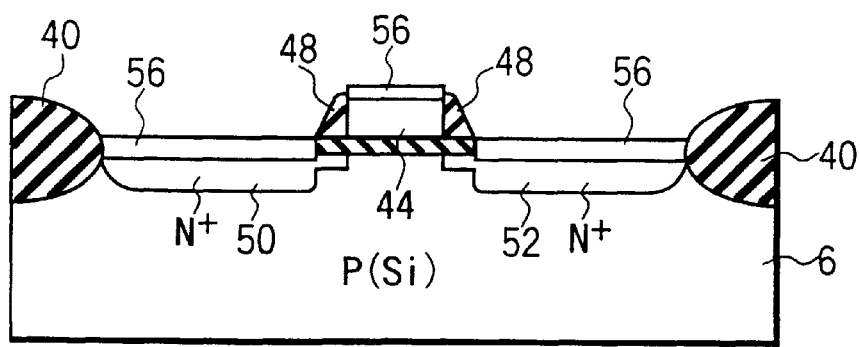

In the next step, Ti is deposited on the entire upper surface of the substrate by a low density plasma CVD using the apparatus shown in FIG. 1 to form a Ti layer 54 covering the $SiO_2$ side wall 48 and the $SiO_2$ field oxide film 40 and a $TiSi_2$ layer 56 covering the silicon regions, i.e., the source region 50, drain region 52 and gate electrode 44, as shown in FIG. 5G. In this experiment, the plasma CVD was performed by applying 200 W of RF power having a frequency of 13.56 MHz under a pressure of 1 Torr. The RF power density was 0.86 $W/cm^2$. The substrate temperature was set at 650° C. The gas flow rate was 10 sccm for the $TiCl_4$ gas, 10,000 sccm for the $H_2$ gas, and 1,000 sccm for the Ar gas. After the CVD which was continued for about 40 seconds, a Ti layer about 50 Å thick and a $TiSi_2$ layer about 400 Å thick were formed on the $SiO_2$ and Si base layers, respectively. The difference in the thickness of the formed layers is considered to have been brought about by the difference in reactivity with the deposited Ti between the $SiO_2$ base layer and the Si base layer, as already pointed out.

Finally, the unreacted Ti layer 54 on the $SiO_2$ layer was removed with an aqueous solution of $NO_4OH/H_2O_2$. The Ti layer 54, which was very thin, was removed in a short time. It was also possible to minimize an undesirable etching of the $TiSi_2$ layer accompanying an over-etching of the Ti layer. Further, since the film-forming ratio of the $TiSi_2$ layer to the Ti layer was as large as about 8 (=400 Å/50 Å), the resistance of the $TiSi_2$ layer was scarcely affected by the undesirable etching noted above.

The resultant semiconductor device was found to exhibit a low sheet resistance of about 5 Ω on each of the gate electrode, source region and drain region so as to allow the device to exhibit satisfactory characteristics.

In the embodiment described above, the silicon substrate used was of P-type. However, it is also possible to use an N-type silicon substrate. In this case, it suffices to reverse the N- and P-types shown in FIGS. 5A to 5H. Also, the techniques employed in the steps except the step shown in FIG. 5 are no more than examples. It may be obvious to those skilled in the art that other techniques can be employed in place of those exemplified in the above description. The conditions for forming the $TiSi_2$ layer and the Ti layer in the step of FIG. 5 are also no more than examples and, thus, can be changed appropriately.

Needless to say, the method of the present invention can also be employed in the manufacture of, for example, CMOS transistors having a P- or N-type wafer.

As described above, the method of the present invention produces prominent effects. To reiterate, titanium is deposited on a silicon substrate having at least one of a P-type region, N-type region and a poly-Si region formed on one surface by CVD using a high frequency plasma of a low density. The particular technique makes it possible to form directly a $TiSi_2$ layer having the C54 crystal phase exhibiting a low resistivity. It follows that the present invention permits decreasing the number of manufacturing process steps, compared with the prior art requiring an annealing treatment for forming a $TiSi_2$ layer. It should also be noted that a $TiSi_2$ layer of the C54 crystal phase can be formed directly by self-alignment on the source-drain regions and gate electrode formed on a surface region of a silicon substrate by simply depositing titanium on the substrate surface by CVD using a high frequency plasma. Since an annealing treatment required in the prior art need not be applied for forming the $TiSi_2$ layer, the number of process steps for manufacturing a semiconductor device can be decreased.

Further, an optimum plasma density can be produced by using, for example, a parallel plate type plasma film-forming apparatus for depositing Ti, making it possible to allow the $TiSi_2$ layer to grow at a rate markedly higher than the growing rate of the Ti layer. Particularly, a high film-forming ratio of the $TiSi_2$ layer to the Ti layer can be achieved by controlling the substrate temperature to fall within a range of 620° C. to 700° C. and by controlling the density of the high frequency power to fall within a range of 0.5 $W/cm^2$ to 2.0 $W/cm^2$.

In the embodiment described above, Ti is deposited on a silicon substrate. However, it is possible to deposit Ti on substrates of other semiconductors or other materials such as glass as far as silicon or poly-Si regions on which a $TiSi_2$ is to be formed are formed on the substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A method of manufacturing a semiconductor device, comprising the steps of:

providing a substrate in a chemical vapor deposition chamber and between a pair of electrodes, said substrate having at least one of a silicon region and a polycrystalline silicon region on a first part of a surface of said substrate and a silicon compound film on a second part of said surface;

applying a high frequency power to at least one electrode of said pair of electrodes;

heating said substrate to a substrate temperature ranging from 620° C. to 700° C.;

depositing titanium on said surface of the substrate by a chemical vapor deposition method using a high frequency plasma of a low density, said titanium, deposited on said one of a silicon region and a polycrystalline silicon region, reacting with one of silicon and polycrystalline silicon to form a titanium silicide ($TiSi_2$) layer having a C54 crystal phase.

2. The method of manufacturing a semiconductor device according to claim 1, wherein said low density of said high frequency plasma is of the order of $10^9$ $cm^{-3}$.

3. A method of manufacturing a semiconductor device, comprising the steps of:

providing a silicon substrate in a chemical vapor deposition (CVD) chamber and between a pair of electrodes, said substrate having a source region, a drain region, a gate electrode and an insulating film formed on a surface;

applying a high frequency power to at least one electrode of said pair of electrodes;

heating said substrate to a substrate temperature ranging from 620° C. to 700° C.;

depositing titanium on said surface of the silicon substrate by CVD using a high frequency plasma of a low density to form a $TiSi_2$ layer having a C54 crystal phase, said $TiSi_2$ layer covering at least said source and drain regions, and a Ti layer covering said insulating film; and removing the Ti layer formed on the insulating film by selective etching.

4. The method of manufacturing a semiconductor device according to claim 3, further comprising:

controlling the substrate temperature and the density of the high frequency power so that a film-forming ratio of said TiSi$_2$ layer formed on said source and drain regions to said Ti layer formed on said insulating film is at least 5.

5. The method of manufacturing a semiconductor device according to claim 4, wherein said substrate temperature ranges from 640° C. to 660° C., and said density of the high frequency power falls within a range of between 0.5 W/cm$^2$ and 2.0 W/cm$^2$.

* * * * *